(12) United States Patent
Yi

(10) Patent No.: US 11,257,891 B2
(45) Date of Patent: Feb. 22, 2022

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 568 days.

(21) Appl. No.: 16/309,113

(22) PCT Filed: Sep. 28, 2018

(86) PCT No.: PCT/CN2018/108168
§ 371 (c)(1),
(2) Date: Dec. 12, 2018

(87) PCT Pub. No.: WO2019/232995
PCT Pub. Date: Dec. 12, 2019

(65) Prior Publication Data
US 2021/0225981 A1    Jul. 22, 2021

(30) Foreign Application Priority Data
Jun. 7, 2018  (CN) .......................... 201810581903.1

(51) Int. Cl.
*H01L 27/32*     (2006.01)

(52) U.S. Cl.
CPC ................ *H01L 27/3276* (2013.01)

(58) Field of Classification Search
None
See application file for complete search history.

(56) References Cited

U.S. PATENT DOCUMENTS

| 2009/0135113 | A1 | 5/2009 | Taneda et al. |
| 2014/0042406 | A1* | 2/2014 | Degner .................. H05K 1/028 |
| | | | 257/40 |

(Continued)

FOREIGN PATENT DOCUMENTS

| CN | 107112349 A | 8/2017 |
| CN | 107275364 A | 10/2017 |

*Primary Examiner* — Dung A. Le
(74) *Attorney, Agent, or Firm* — Soroker Agmon Nordman

(57) ABSTRACT

The invention discloses a display panel including a first section of a first power trace and a second power trace, an active region and a non-display region, a bending region, and a fanout routing region and a component disposing region; the first section of the first power trace connected to a second section of the first power trace disposing within the component disposing region; and the first section of the second power trace connected to a second section of the second power trace disposing within the component placement region by at least one set of second connection sub-traces disposed within the bending region. The invention changes power line structure of the display panel, and utilizes the second connecting sub-lines for, bridging so that part of the traces can be bent to backside of the display panel, thereby achieving the bottom border of the display to have narrow borders.

18 Claims, 8 Drawing Sheets

(56) References Cited

U.S. PATENT DOCUMENTS

2017/0237027 A1    8/2017  Lee et al.
2017/0287936 A1*  10/2017  Kim .................... H01L 27/3279
2017/0288008 A1*  10/2017  Kim .................... H01L 51/0097
2019/0095007 A1*   3/2019  Jeong .................. G06F 3/0446

* cited by examiner

DISPLAY PANEL

FIELD OF INVENTION

The present invention relates to a display panel, and more particularly to a bendable and narrow border display panel.

BACKGROUND OF INVENTION

Currently, the display panel industry has developed, for example, active-matrix organic light-emitting diodes (AMOLEDs), which can be self-luminous, and when an electric current passes through the organic material, the organic material emits light, so that AMOLED is not required to additionally provide a backlight module. Furthermore, the AMOLED display panel can use a very thin coating organic material and a very thin glass substrate, so the display panel can be thinner than conventional displays, and has advantages such as wide viewing angles, high color saturation, high contrast, low driving voltage, low power consumption, fast response times, light weight, simple configuration, and low cost.

China utility model patent No. 205140985U discloses a flexible AMOLED display panel structure comprising a first substrate and a second substrate, the second substrate being a protective cover plate, and the first substrate comprising a display region and a non-display region, wherein the non-display region is disposed around the display region and is bilaterally symmetric. Each of contacts of a controller connecting interface disposed on the non-display region is connected to each of data traces within the display region by a metal routing structure, and the metal routing structure includes a bending routing region and a fanout routing region, each metal trace in a bending routing region and each metal trace in the fanout routing region is connected to each other one by one. By changing the metal routing structure of the flexible AMOLED display panel, resistance of the metal traces in the bending routing region and resistance of the metal traces in the fanout routing region are more uniform, and the display region in the entire display panel is proportionally increased, therefore increasing area of the display region.

Please refer to FIG. 1, which shows a display panel 100 for a conventional smartphone 1. The smartphone 1 includes a display panel 100. The display panel 100 includes a display region 101 and a non-display region 102, the non-display region 102 is distributed around the display region 101 and is bilaterally symmetric. A component disposing region 103 is disposed under the display region 101 and configured for disposing a plurality of traces (not shown) and at least one control chip 105. Next, please refer to FIG. 2, where a fanout routing region 104 is disposed within the component disposing region 103, and the fanout routing region 104 has a plurality of traces configured for connecting the display region 101 and the control chip 105, thereby controlling the display region 101 by the control chip 105. Furthermore, a high-potential power trace 106 is disposed within the component disposing region 103 and under the display region 101 to provide a high-potential voltage to the display region 101. A low-potential power trace 107 surrounds the display region 101 and extends downwardly outside the high-potential power trace 106 and is retracted below the high-potential power trace 106. Then, the low-potential power trace 107 is parallel to the high-potential power trace 106, and extends downwardly to connect the control chip 105.

Technical Problem of Background

However, the display panel 100 still has the following problems in actual use. For example, the bottom border of the existing smart phone 1 tends to have a non-display region, so that the display panel 100 has a reserved space within the underside of the non-display region 102 for disposing the plurality of traces and the control chip 105, so the existing smart phone cannot realize narrow border design.

As mentioned above in the background, the non-display region is bent backwards. However, if the non-display region is bent backwards, the bending region requires to be placed in a region where the metal is less laid (for example, if the low-potential power trace and the high-potential power trace parallel to each other by upper and lower columns, the bending region needs to be placed in a region where the low-potential power trace and the high-potential power trace keep off. For example, as described above in the background, the bending region is placed between the low-potential power trace (and the high-potential power trace) and the control chip, as shown by the line BL), in order to avoid crack of the metal traces or delamination between the metal traces and non-metallic layers which is adjacent to the metal traces. This kind of design still has a little bit of border (for placing the low-potential power trace and the high-potential power trace), and it limits achievement of a true narrow border design. Therefore, if a narrowest border design is to be realized, the bending region must be placed close to the high-potential power trace, but bending may cause the delamination at the high-potential power trace, and results problems of product reliability. More seriously, the traces placed within the bending region may break, and results product failure.

Therefore, it is necessary to provide a display panel to solve the problems existing in the conventional art, to allow that the bottom border of the display panel can realize a true narrow border design, and to avoid the narrow border design that may cause product reliability problems or product failure due to trace breakage.

SUMMARY OF INVENTION

In view of above mentioned, the present invention is to provide a display panel to solve the problem that a length of a bottom border of a display panel is too long in the conventional art, and cannot satisfy the full-screen display design.

The main object of the present invention is to provide a display panel which can greatly shorten a length of a bottom border of the display panel, so the length of the bottom border is shortened to 0.8 mm to 2.0 mm, thereby achieving the full-screen display design.

Another object of the present invention is to provide a display panel that can increase the flexibility of the bending region by disposing connecting traces within the bending region, and greatly shorten the length of the bottom border of the display panel to realize the full-screen display design.

In order to achieve the foregoing objects of the present invention, an embodiment of the present invention provides a display panel, including: an active region and a non-display region, the non-display region disposed around the active region and extending to form a bending region, a fanout routing region, and a component disposing region; the component disposing region having a plurality of component connecting pads; wherein a first section of a first power trace is disposed within the non-display region around the active region, the first section of the first power trace is connected to a second section of the first power trace disposed within the component disposing region, and the second section of the first power trace is connected to the plurality of component connecting pads; and a first section of a second power trace is disposed adjacent to the active region and disposed between the active region and the bending region, the first section of the second power trace is connected to a second section of the second power trace disposed within the component disposing region by at least a set of second connecting sub-traces disposed within the bending region, and the second portion of the second power trace is connected to the plurality of component connecting pads.

Furthermore, another embodiment of the present invention provides another display panel, including: an active region and a non-display region, the non-display region disposed around the active region and extending to form a bending region and a component disposing region, wherein the bending region defines a left section, a middle section, and a right section, the component disposing region having a plurality of component connecting pads; and a plurality of data traces passing through the bending region and connected with the active region and the plurality of component connecting pads; wherein a first section of a power trace is disposed adjacent to the active region, the first section of the power trace is connected to a second section of the power trace disposed within the component disposing region by three sets of connecting sub-traces passing through the left section, the middle section and the right section, and the second section of the power trace is connected to the plurality of component connecting pads.

In addition, another embodiment of the present invention provides a display panel, including: an active region and a non-display region, the non-display region disposed around the active region and extending to form a bending region and a component disposing region; wherein a first section of a power trace is disposed adjacent to the active region, the first section of the power trace is separately connected to a second section of the power trace disposed within the component disposing region by at least one set of connecting sub-traces passing through the bending region.

In an embodiment of the invention, the first section of the second power trace and the second section of the second power trace are parallel to each other, and a width of the first section of the second power trace and a width of the second section of the second power trace are greater than a width of the second connecting sub-trace.

In an embodiment of the invention, the first section of the power trace and the second section of the power trace are parallel to each other, and a width of the first section of the power trace is less than a width of the second section of the power trace and greater than a width of the plurality of connecting sub-traces.

In an embodiment of the invention, the first section of the second power trace and the second section of the second power trace are parallel to each other, and a width of the first section of the second power trace is less than a width of the second section of the second power trace, and is greater than a width of the second connecting sub-trace.

In an embodiment of the invention, the first section of the power trace and the second section of the power trace are parallel to each other, and a width of the first section of the power trace is less than a width of the second section of the power trace, and is greater than a width of the plurality of connecting sub-traces.

In an embodiment of the invention, the first section of the second power trace is separately connected to the second section of the second power trace disposed within the component disposing region by two sets of second connecting sub-traces passing through two sections of the bending region.

In an embodiment of the invention, the first section of the power trace is separately connected to the second section of the power trace disposed within the component disposing region by two sets of the plurality of connecting sub-traces passing through two sections of the bending region.

In an embodiment of the present invention, the first section of the second power trace is separately connected to the second section of the second power trace disposed within the component disposing region by three sets of the plurality of connecting sub-traces passing through the left section, the middle section and the right section of the bending region.

In an embodiment of the present invention, the first section of the power trace is separately connected to the second section of the power trace disposed within the component disposing region by three sets of the plurality of connecting sub-traces passing through the left section, the middle section and the right section of the bending region.

In an embodiment of the invention, a width of the first section of the second power trace is not greater than 150 microns.

In one embodiment of the invention, a width of the first section of the power trace is not greater than 150 microns.

In one embodiment of the invention, a width of the connecting sub-traces is not greater than 20 microns.

In one embodiment of the invention, a width of the second section of the power trace is not greater than 250 microns.

In an embodiment of the invention, the first section of the first power trace is separately connected to the second section of the first power trace disposed within the component disposing region by a plurality of first connecting sub-traces disposed within the bending region.

In an embodiment of the present invention, a width of the first section of the first power trace and a width of the second section of the first power trace are greater than a width of the first connecting sub-trace.

In an embodiment of the invention, a width of the first connecting sub-trace is not greater than 20 microns.

In an embodiment of the present invention, the fanout routing region further includes a plurality of data traces, and wherein a material of the first connecting sub-traces and the second connecting sub-traces located within the bending region and a material of the plurality of data traces is selected from a group consisting of titanium-aluminum-titanium, molybdenum, copper, and silver nanowire.

beneficial effect:

Compared with the conventional art, the display panel of the present invention is not only greatly shorten a length of a bottom border of the display panel, but also realize the full-screen display design, and can also have a smaller smartphone size under the same display size.

DRAWINGS

In order to make the above-mentioned contents of the present invention more comprehensible, the preferred embodiments are described below, and in conjunction with the accompanying drawings, the detailed description is as follows.

DETAILED DESCRIPTION OF PREFERRED EMBODIMENTS

The following description of the various embodiments is provided to illustrate the specific embodiments of the invention. Furthermore, the directional terms mentioned in the present invention, such as upper, lower, top, bottom, front, rear, left, right, inner, outer, side, surrounding, central, horizontal, lateral, vertical, longitudinal, axial, radial, uppermost or lowermost, etc., only refer to the direction of the accompanying drawings. Therefore, the directional terms used is for the purpose of illustration and understanding of the invention, instead of limiting the present invention.

Figure 1:
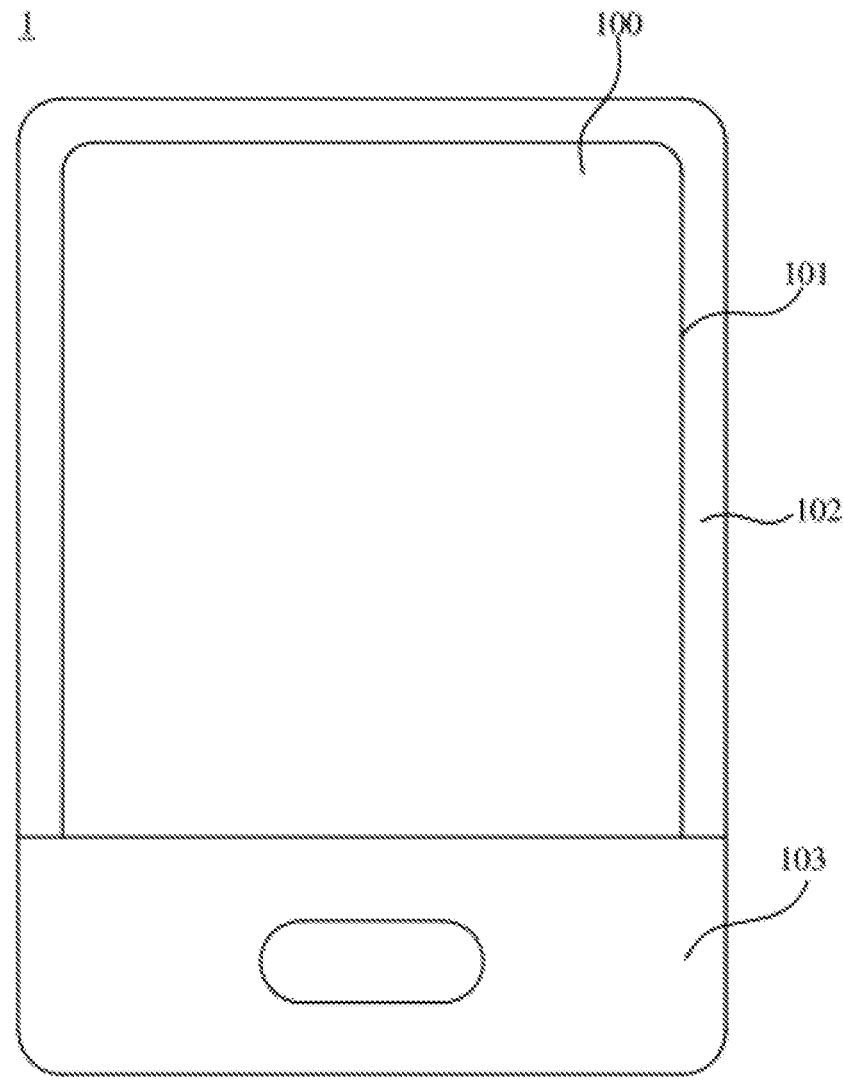
FIG. 1 is a schematic view that a conventional display panel is disposed in a smart phone.
Figure 2:
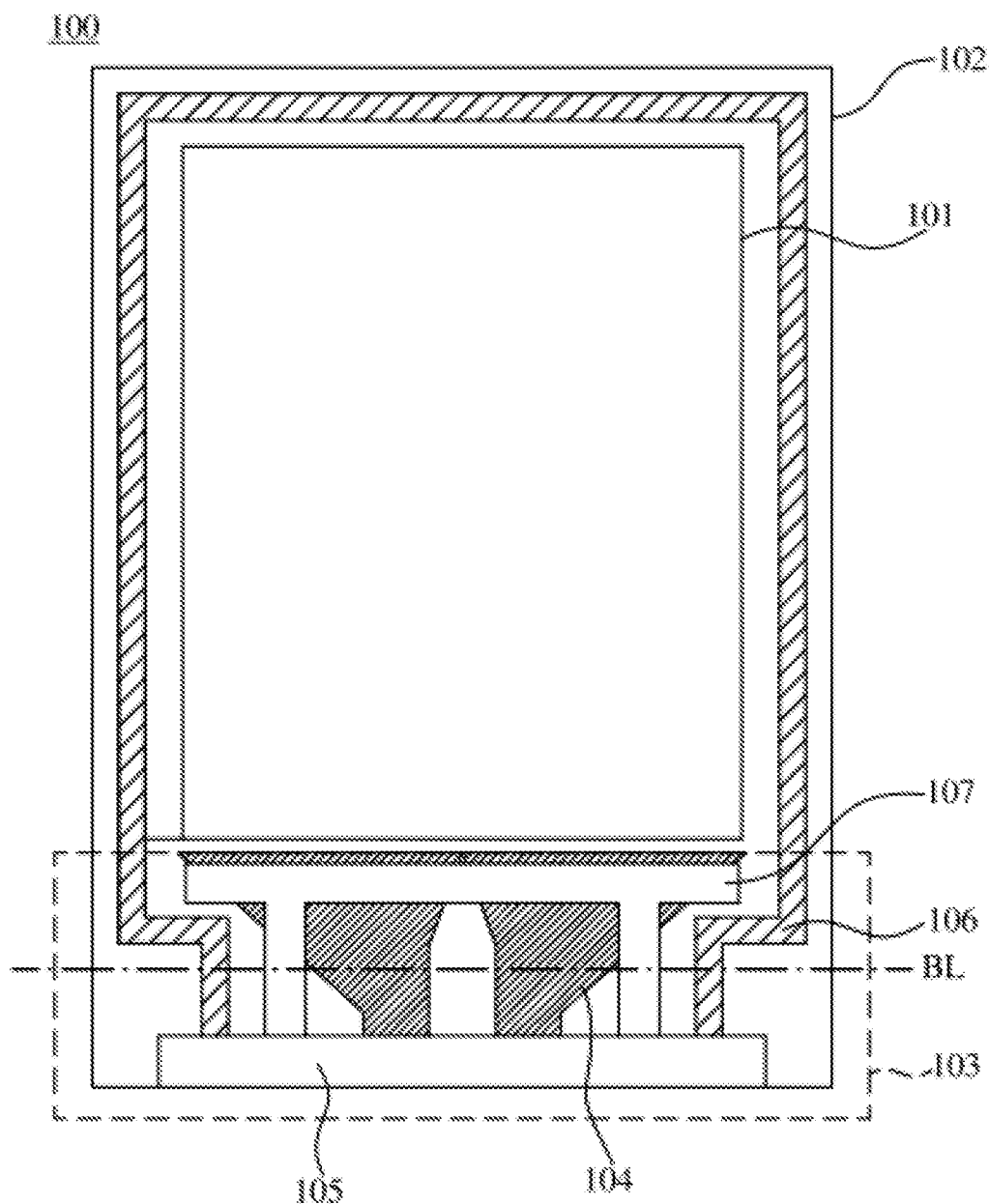
FIG. 2 is a schematic view of the conventional display panel as shown in FIG. 1.
Figure 3:
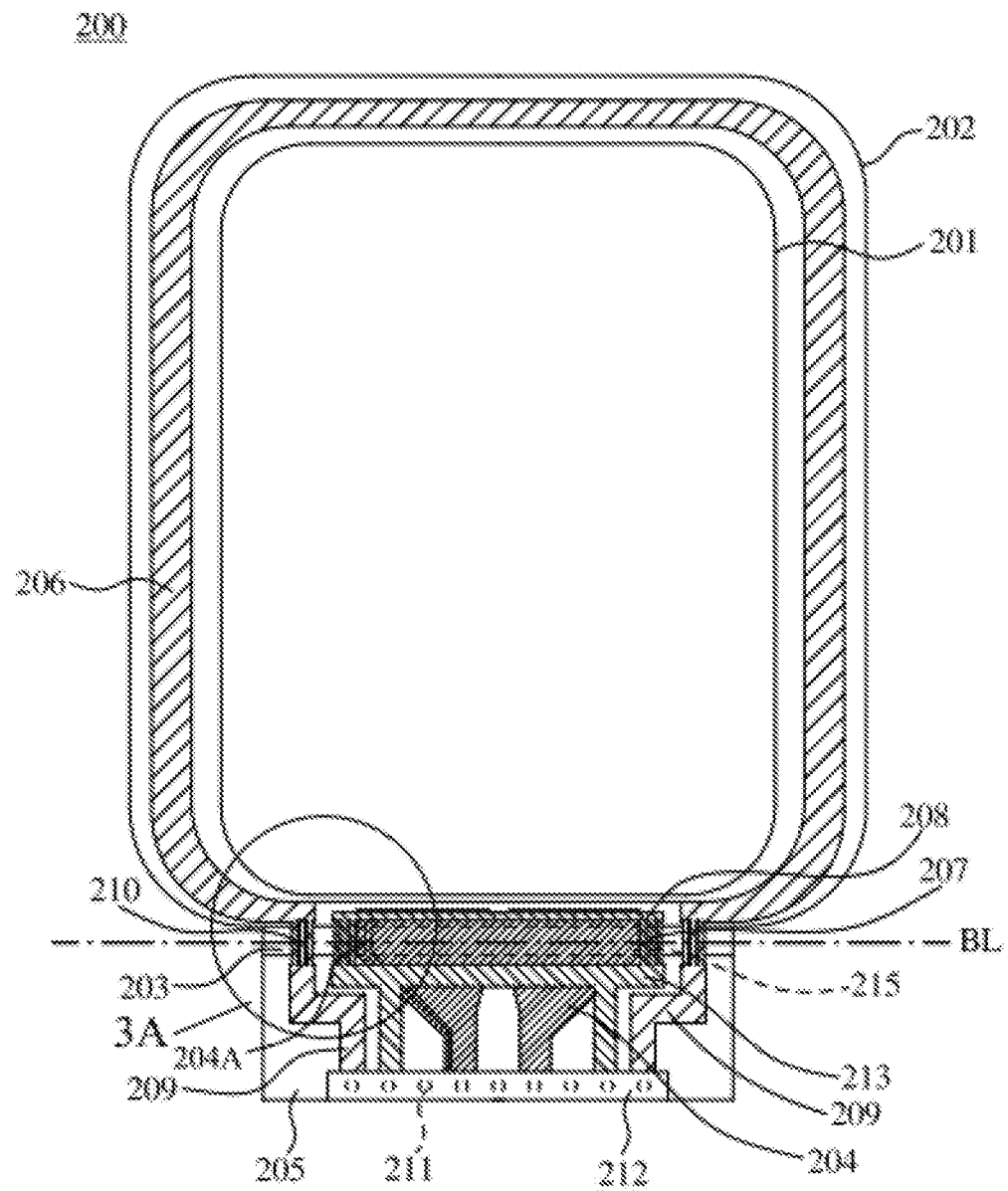
FIG. 3 is a schematic top plan view of a display panel according to a first embodiment of the present invention.

Please refer to FIG. 3, a display panel according to a first embodiment of the present invention mainly includes a display module 200. The display module 200 includes an active region 201 and a non-display region 202. The non-display region 202 is disposed around the active region 201 and extending downward to form a bending region 203, a fanout routing region 204 and a component disposing region 205. The component disposing region 205 has a plurality of component connecting pads 211. A plurality of data traces 204A, pass through the bending region 203 and the fanout routing region 204, and connect to the active region 201 and the plurality of component coupling pads 211. A first section 206 of a first power trace is disposed within the non-display region 202 around the active region 201. The first section 206 of the first power trace is connected to two second sections 209 of the first power trace disposed within the component disposing region 205. The first section 206 of the first power trace is separately connected to the two second sections 209 disposed within the component disposing region 205 by a plurality of first connecting sub-traces 210 disposed within the bending region 203. The second sections 209 of the first power trace are connected to the plurality of component connecting pads 211. A first section 208 of a second power trace is disposed adjacent to the active region 201 and disposed between the active region 201 and the extending region 203. The first section 208 of the second power trace is connected to a second section 213 of the second power trace disposed within the component region 205 by at least a set of second connecting sub-traces 207 disposed within the bending region 203, and the second section 213 of the second power trace is connected to the plurality of component connecting pads 211.

The first embodiment of the present invention will be described the detailed structure, the configuration relationship and the operating principle of each component in detail hereinafter in conjunction with FIGS. 3 and 4.

Please refer to FIG. 3, the display panel of the first embodiment of the present invention mainly includes the display module 200. The display module 200 can be formed by a glass substrate or an organic substrate. The display module 200 may form with an active region 201 and a non-display region 202, the active region 201 and the non-display region 202 may be formed on the glass substrate or the organic substrate. The active region 201 includes a plurality of thin-film transistors to control the emitting of the display panel. In this embodiment, the display panel is a flexible organic light emitting display panel. The non-display region 202 disposes around the active region 201 and extends downward to form a bending region 203, a fanout routing region 204, and a component disposing region 205. The component disposing region 205 has a plurality of component connecting pads 211. In the first embodiment of the present invention, the non-display region is formed by a polyimide (PI) substrate. The active region 201 has a plurality of data traces 204A connected to the plurality of thin film transistors, and the plurality of data traces 204A extend through the bending region 203 and the fanout routing region 204. In other words, the fanout routing region 204 has a plurality of metal traces (not shown), and a portion of the plurality of metal traces may be the plurality of data traces 204A. The plurality of metal traces may be gate lines of the plurality of thin film transistors. The plurality of data traces 204A are connected to the active region 201 and the plurality of component connecting pads 211. The plurality of component connecting pads 211 are configured for connecting an electronic component 212, for example, for connecting a controller chip. In other embodiments, the plurality of component connecting pads 211 can joint with a rigid board by using techniques of rigid-flex board. The electronic component 212 may be a package unit after being encapsulated, or a bare die connected to the plurality of component connecting pads 211 by a plurality of bumps 211 in a flip chip manner. The electronic component 212 can be replaced with other electronic components, such as passive components. In one embodiment, a material of the first connecting sub-traces and the second connecting sub-traces located within the bending region and a material of the plurality of data traces is selected from a group consisting of titanium-aluminum-titanium, molybdenum, copper, and silver nanowire.

Please refer to FIG. 3, the display panel of the first embodiment of the present invention, the first section 206 of the first power trace is disposed in the non-display region 202 and around the active region 201, and a shape of the first section 206 of the first power trace is designed to match a shape of the active region 201, thereby reduce the border of the display. In this embodiment, the first section 206 of the first power trace is a low-potential power trace (VSS). The first section 206 of the first power trace is connected to two second sections 209 of the first power trace disposed within the component disposing region 205. In this embodiment, the first section 206 of the first power trace separately connects to the second sections 209 of the first power trace by the plurality of first connecting sub-traces 210 disposed within the bending region. A width of the first section 206 of the first power trace and a width of the second section 209 of the first power trace are greater than a width of the first connecting sub-trace 210. The width of the first connecting sub-trace 210 is not greater than 20 microns, such as 1 micron to 20 microns. A pitch of the first connecting sub-traces 210 ranges from 3 microns to 8 microns. In this embodiment, for example, the width of the first section 206 of the first power trace is 200 microns, the width of the first connecting sub-trace 210 is 15 microns, and a pitch of the second connecting sub-traces is 5 microns. In other words, the first section 206 of the first power trace is connected to the second section 209 of the first power trace by a set of ten first connecting sub-traces 210. Thus, when the bending region 203 is bent along the BL line, the plurality of first connecting sub-traces 210 can disperse the stress to avoid trace breakage and delamination between the metal layer and the non-metal layer. Moreover, if some of the first connecting sub-traces 210 are broken, there are still other portions of the first connecting sub-traces 210 connected without causing product failure. In other embodiments, the two ends of the first section of the first power trace may be designed as a hollow trace in the form of a metal mesh and connect to the second section 209 of the first power trace and then connect to the plurality of component connecting pads 211. Other implementations that enable to increase the flexible of the traces, to avoid breakage of traces, and delamination between the metal layer and non-metal layer are all considered. A width of the left and right sides of the first section 206 of the first power trace is greater than a width of the upper and lower sides of the first section 206 of the first power trace. When a longitudinal routing wire of the first section 206 of the first power trace is turn to a lateral routing wire of the first section 206 of the first power trace, the first section 206 of the first power trace is in a tapered form (for example, a width of the longitudinal routing wire of the first section 206 of the first power trace is 300 microns, and then turns to the lateral routing wire, a width of the lateral routing wire of the first section 206 of the first power trace is tapered to 150 microns). As such, the bottom border of the display panel can be further reduced.

Figure 3A:
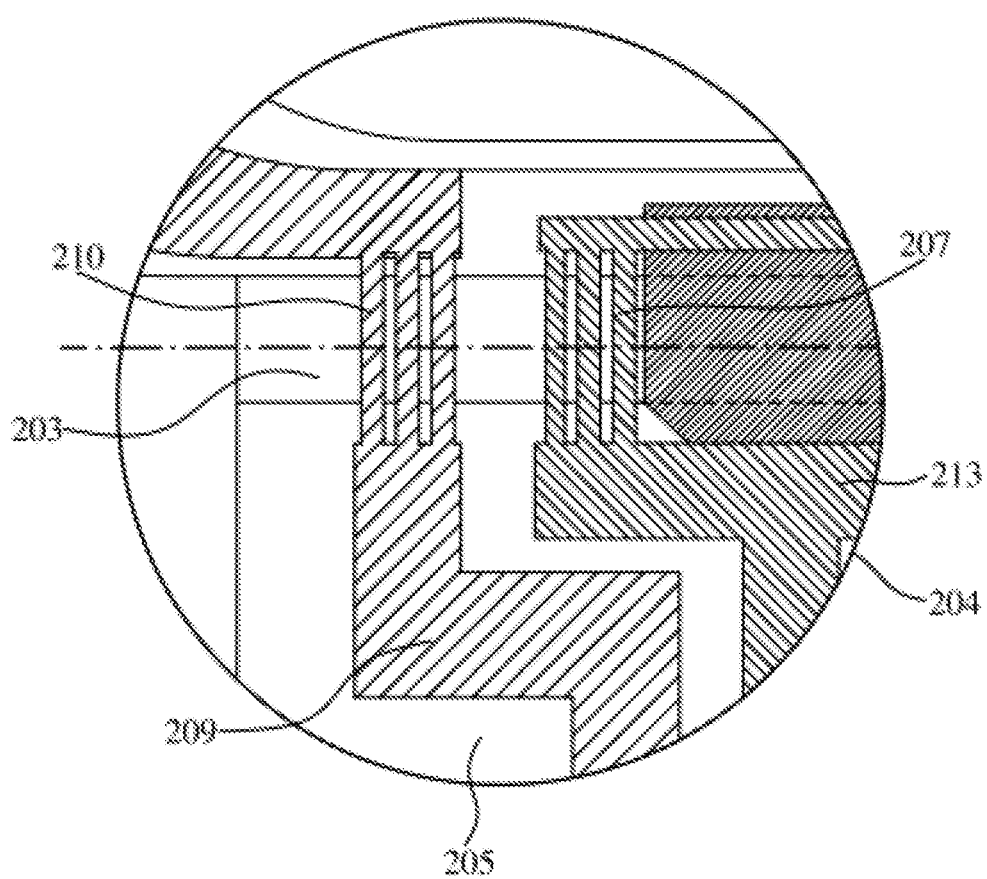
FIG. 3A is a schematic partially enlarged view of the display panel according to the first embodiment of the present invention.

Please refer to FIG. 3, the display panel according to the first embodiment of the present invention, the first section 208 of the second power trace is disposed under the active region 201 and disposed between the active region 201 and the bending region 203. In this embodiment, the first section 208 of the second power trace is a high-potential power trace (VDD). The first section 206 of the first power trace and the first section 208 of the second power trace are parallel to each other and located on a same extension line. The first section 208 of the second power trace is connected to the second section 213 of the second power trace disposed within the component disposing region 205 by at least a set of second connecting sub-traces 207 passing through the bending region 203. The second section 213 of the second power trace is located above the fanout routing region 204. The second section 213 of the second power trace is connected to the plurality of component connecting pads 211. The first section 208 of the second power trace and the second section 213 of the second power trace are parallel to each other. A width of the first section 208 of the second power trace is less than a width of the second section 213 of the second power trace, and greater than a width of the second connecting sub-trace 207. The width of the first section 208 of the second power trace is not greater than 150 microns, for example, 50 microns to 150 microns, and the width of the second section 213 of the second power trace is not greater than 250 microns, for example, 150 microns to 250 microns. The width of the second connecting sub-trace 207 is not greater than 20 microns, for example, 1 micron to 20 microns, and a pitch of the second connecting sub-traces ranges from 3 microns to 8 microns. Please refer to FIG. 3A, shows a schematic partially enlarged view of the display panel according to the first embodiment of the present invention. In this embodiment, for example, the width of the first section 208 of the second power trace is 50 microns, the width of the second connecting sub-trace 207 is 15 microns, and the pitch of the second connecting sub-traces is 5 microns. The first section 208 of the second power trace may separately connect to the second section 213 of the second power trace by the (for example, a set of ten) second connecting sub-traces 207. The first section 208 of the second power trace is separately connected to the second section 213 of the second power trace disposed within the component disposing region 205 by two sets of the second connecting sub-traces 207 passing through two sections of the bending region 203. In this embodiment, the second connecting sub-traces 207 are separately disposed at two ends of the first section 208 of the second power trace and the second section 213 of the second power trace, and an intermediate hollow region 215 is not laid with metal layer to reduce a proportion of the metal layer, so the flexibility of the bending region increases. In this embodiment, the first section 208 of the second power trace and the second section 213 of the second power trace have the same electric potential, and are connected to each other in parallel by the second connecting sub-traces 207, so that the first section 208 of the second power trace and the second section 213 of the second power trace can have the same electric potential. In other embodiments, the intermediate hollow region 215 may have a plurality of via holes that vertically conduct signals between different layers. In another embodiment, the second connecting sub-traces 207 is designed in a metal mesh, which can also reduce the proportion of the metal layer, and increase the flexibility of the bending region.

Figure 4:
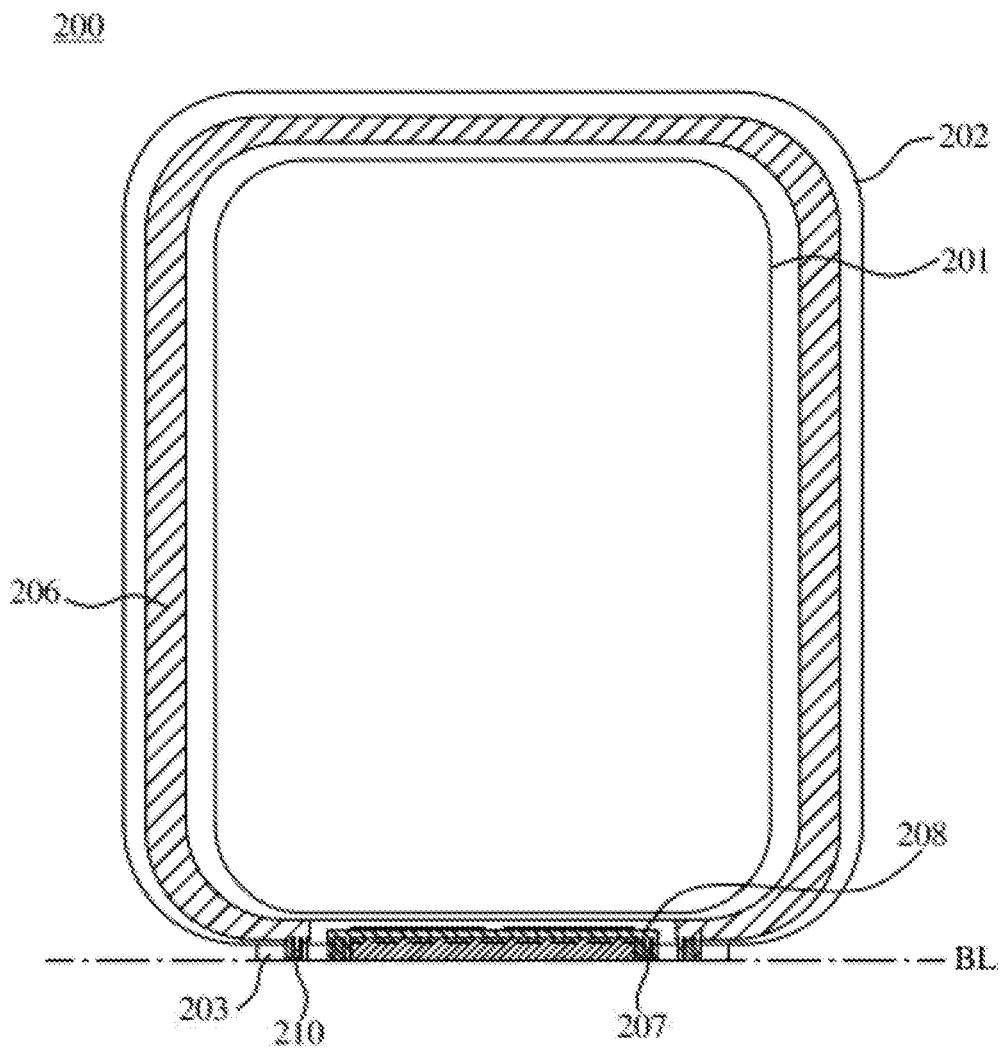
FIG. 4 is a schematic view of the display panel according to the first embodiment of the present invention after the display panel is bent.

Pease refer to FIG. 4, shows a schematic view of the display panel according to the first embodiment of the present invention after the display panel is bent, and generally uses the same component name and reference number. After the bending region 203 is bent along the BL line, the bottom border of the display panel is significantly less than the bottom border of the background art.

Figure 5:
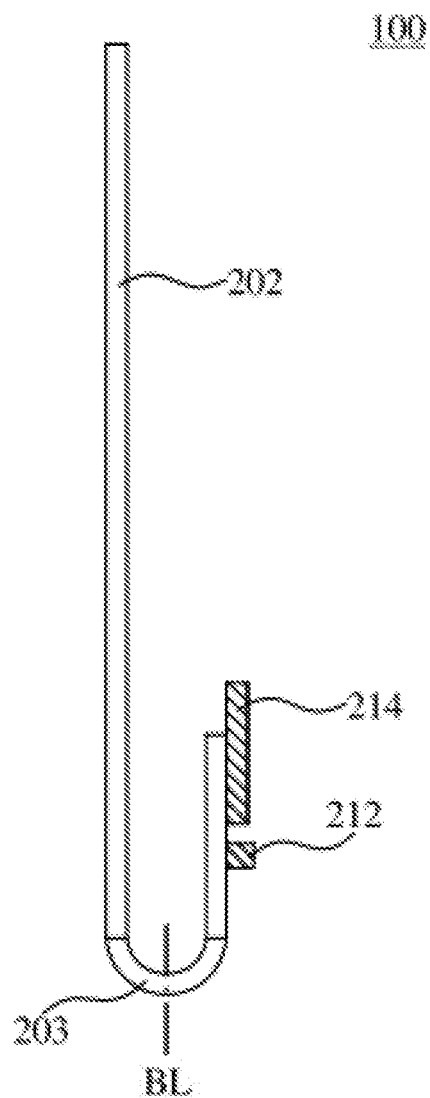
FIG. 5 is a schematic side view of the display panel according to the first embodiment of the present invention that the component disposing region is bent to a backside of the display panel.

Please refer to FIG. 5, shows a schematic side view of the display panel according to the first embodiment of the present invention after bending the display panel is bent, and generally uses the same component name and reference number. After the bending region 203 is bent along the BL line, the component disposing region 205 of the display panel is bent to the backside of the display panel, and the component disposing region 205 can further combine with a flexible printed circuit (FPC) 214, so that a size of the bottom border of the front surface of the display panel can be greatly reduced.

Figure 6:
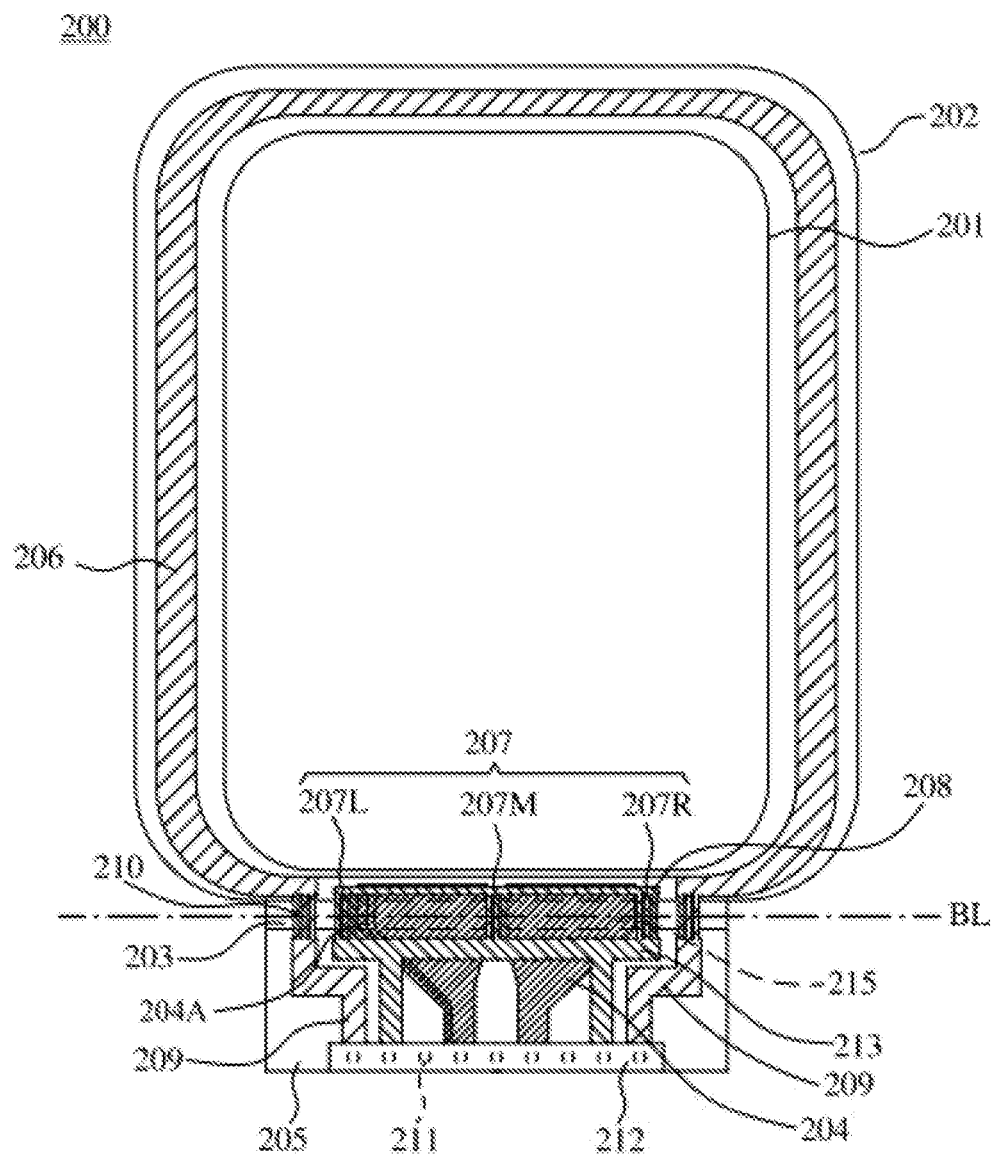
FIG. 6 is a schematic view of a display panel according to a second embodiment of the present invention.

Please refer to FIG. 6, a display panel according to a second embodiment of the present invention is similar to the first embodiment of the present invention, and generally uses the same component name and reference number, but the difference of the second embodiment is that: the bending region 203 further defines a left section 207L, a middle section 207M and a right section 207R. A first section 208 of a power trace is separately connect to a second section 213 of the power trace disposed within a component disposing region 20 by three sets of the second connecting sub-traces 210 passing through the left section 207L, the middle section 207M, and the right section 207R of the bending region 203. The second section 213 of the power trace is connected to a plurality of component connecting pads 211. In one embodiment, the power trace may be equivalent to the second power trace described in FIG. 3. An advantage of the above feature is that: the power trace 208 is separately connected to the second section 213 of the power trace disposed within the component disposing region 20 by the three sets of the second connecting sub-traces 210 passing through the left section 207L, the middle section 207M, and the right section 207R of the bending region 203. Therefore, it is not only greatly shortening a length of the bottom border of the display panel, thereby achieving the full-screen display design, but also preventing traces from being broken due to bending, and even if some traces are broken, the product function is still able to operate, thereby further increasing product reliability and avoiding product failure due to traces breakage.

Figure 7:
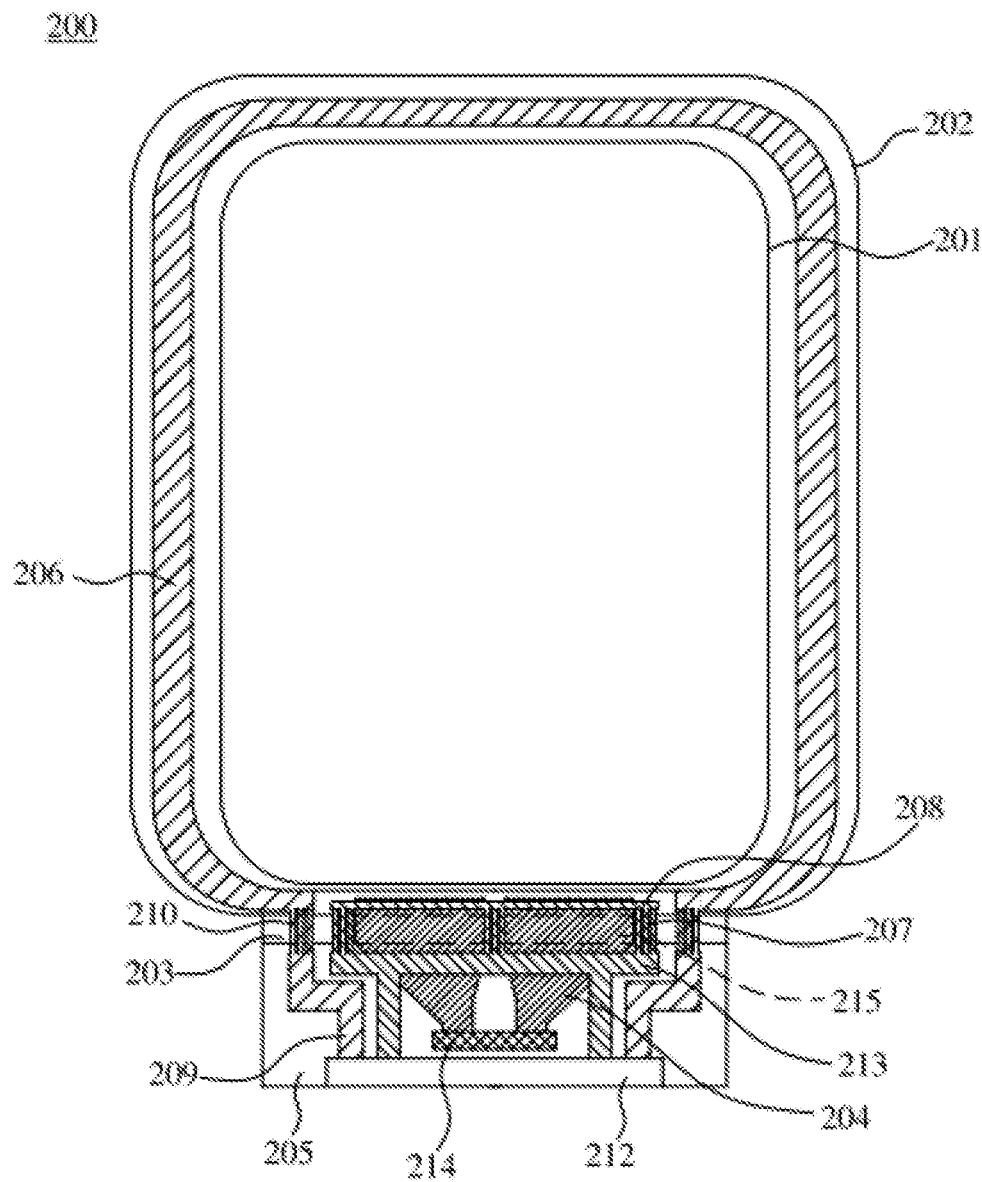
FIG. 7 is a schematic view of a display panel according to a third embodiment of the present invention.

Please refer to FIG. 7, a display panel according to a third embodiment of the present invention is similar to the second embodiment of the present invention, and generally uses the same component name and reference number, but the difference with the second embodiment is that: an electronic component 212 is disposed on the component disposing region 205. A flexible circuit board 214 can be provided additionally.

The present invention has been described by the above embodiments, but the above embodiments are merely examples for implementing the present invention. It must be noted that the disclosed embodiments do not limit the scope of the invention. Conversely, modifications and equivalent arrangements are intended to be included within the scope of the invention.

The invention claimed is:

1. A display panel, comprising:
an active region and a non-display region, the non-display region disposed around the active region and extending to form a bending region, a fanout routing region, and a component disposing region; the component disposing region having a plurality of component connecting pads;
wherein a first section of a first power trace is disposed within the non-display region around the active region, the first section of the first power trace is connected to a second section of the first power trace disposed within the component disposing region, and the second section of the first power trace is connected to the plurality of component connecting pads; and
a first section of a second power trace is disposed adjacent to the active region and disposed between the active region and the bending region, the first section of the second power trace is connected to a second section of the second power trace disposed within the component disposing region by at least a set of second connecting sub-traces disposed within the bending region, and the second portion of the second power trace is connected to the plurality of component connecting pads,
wherein the first section of the second power trace is separately connected to the second section of the second power trace disposed within the component disposing region by two sets of the second connecting sub-traces passing through two sections of the bending region.

2. The display panel according to claim 1, wherein the first section of the second power trace and the second section of the second power trace are parallel to each other, and a width of the first section of the second power trace is less than a width of the second section of the second power trace, and is greater than a width of the second connecting sub-trace.

3. The display panel according to claim 1, wherein the first section of the second power trace is separately connected to the second section of the second power trace disposed within the component disposing region by three sets of the second connecting sub-traces passing through a left section, a middle section, and a right section of the bending region.

4. The display panel according to claim 2, wherein a width of the first section of the second power trace is not greater than ISO microns.

5. The display panel according to claim 2, wherein a width of the second connecting sub-trace is not greater than 20 microns.

6. The display panel according to claim 3, wherein a width of the second section of the second power trace is not greater than 250 microns.

7. The display panel according to claim 1, wherein the first section of the first power trace is separately connected to the second section of the first power trace disposed within the component disposing region by a plurality of first connecting sub-traces disposed within the bending region.

8. The display panel according to claim 6, wherein a width of the first section of the first power trace and a width of the second section of the first power trace are greater than a width of the first connecting sub-trace.

9. The display panel according to claim 6, wherein a width of the first connecting sub-trace is not greater than 20 microns.

10. The display panel according to claim 1, wherein the fanout routing region further comprises a plurality of data traces, and wherein a material of the first connecting sub-traces and the second connecting sub-traces located within the bending region and a material of the plurality of data traces is selected from a group consisting of titanium-aluminum-titanium, molybdenum, copper, and silver nanowire.

11. A display panel comprising:
an active region and a non-display region, the non-display region disposed around the active region and extending to form a bending region and a component disposing region, wherein the bending region defines a left section, a middle section, and a right section, the component disposing region having a plurality of component connecting pads; and
a plurality of data traces passing through the bending region and connected with the active region and the plurality of component connecting pads;
wherein a first section of a power trace is disposed adjacent to the active region, the first section of the power trace is connected to a second section of the power trace disposed within the component disposing region by three sets of connecting sub-traces passing through the left section, the middle section and the right section, and the second section of the power trace is connected to the plurality of component connecting pads.

12. The display panel according to claim 11, wherein the first section of the power trace and the second section of the power trace are parallel to each other, and a width of the first section of the power trace is less than a width of the second section of the power trace, and is greater than a width of the connecting sub-trace.

13. The display panel according to claim 12, wherein a width of the first section of the power trace is not greater than 150 microns.

14. The display panel according to claim 12, wherein a width of the connecting sub-trace is not greater than 20 microns.

15. The display panel according to claim 12, wherein a width of the second section of the power trace is not greater than 250 microns.

16. A display panel comprising:
an active region and a non-display region, the non-display region disposed around the active region and extending to form a bending region and a component disposing region;
wherein a first section of a power trace is disposed adjacent to the active region, the first section of the power trace is separately connected to a second section of the power trace disposed within the component disposing region by at least one set of connecting sub-traces passing through the bending region,
wherein the first section of the power trace is separately connected to the second section of the power trace disposed within the component disposing region by three sets of connecting sub-traces passing through a left section, a middle section and a right section of the bending region.

17. The display panel according to claim 16, wherein the first section of the power trace and the second section of the power trace are parallel to each other, and a width of the first section of the power trace is less than a width of the second section of the power trace, and is greater than a width of the connecting sub-trace.

18. The display panel according to claim 16, wherein the first section of the power trace is separately connected to the second section of the power trace disposed within the component disposing region by two sets of the connecting sub-traces passing through two sections of the bending region.

* * * * *